(12) United States Patent
Lin et al.

(10) Patent No.: US 9,490,809 B2
(45) Date of Patent: Nov. 8, 2016

(54) SHIFT REGISTER CIRCUIT

(71) Applicant: AU OPTRONICS CORP., Hsin-Chu (TW)

(72) Inventors: Wei-Li Lin, Hsin-Chu (TW); Che-Wei Tung, Hsin-Chu (TW); Chia-Heng Chen, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 123 days.

(21) Appl. No.: 14/277,918

(22) Filed: May 15, 2014

(65) Prior Publication Data
US 2015/0288364 A1 Oct. 8, 2015

(30) Foreign Application Priority Data

Apr. 7, 2014 (TW) .............................. 103112737 A

(51) Int. Cl.
*G11C 19/00* (2006.01)
*H03K 19/003* (2006.01)
*G11C 19/28* (2006.01)

(52) U.S. Cl.
CPC ....... *H03K 19/00384* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 5,859,630 A | 1/1999 | Huq et al. | |
| 8,306,177 B2 * | 11/2012 | Lee | G09G 3/3677 377/64 |
| 8,515,000 B2 * | 8/2013 | Yang | G11C 19/28 377/64 |
| 8,552,961 B2 | 10/2013 | Yang et al. | |
| 2006/0146978 A1 | 7/2006 | Jang | |
| 2008/0056430 A1 | 3/2008 | Chang et al. | |
| 2010/0316182 A1 * | 12/2010 | Lai | G11C 19/28 377/79 |
| 2014/0119491 A1 * | 5/2014 | Liu | G11C 19/28 377/64 |
| 2014/0355732 A1 * | 12/2014 | Lin | G11C 19/28 377/64 |
| 2014/0369457 A1 * | 12/2014 | Lin | G11C 19/28 377/64 |

OTHER PUBLICATIONS

TaiwanPatent Office, "Office Action", Jan. 13, 2014.

* cited by examiner

*Primary Examiner* — Tuan T Lam
(74) *Attorney, Agent, or Firm* — WPAT, PC; Justin King

(57) ABSTRACT

A shift register circuit includes a pull-down circuit, pull-down control circuit, a driving unit, a primary pull-down circuit and a gate driver circuit. The pull-down control circuit is electrically connected to the pull-down circuit and configured to provide an nth-stage pull-down control signal to the pull-down circuit. The a driving unit is electrically connected to the pull-down control circuit and configured to drive the pull-down control circuit. The primary pull-down circuit is electrically connected to the pull-down circuit. The gate driver circuit is electrically connected to the pull-down circuit and configured to output an nth-stage gate driving signal according to an nth-stage control signal. The driving unit is configured to receive a plurality of high-frequency clock signals and accordingly to pre-enable the pull-down control circuit, and n is a positive integer.

13 Claims, 6 Drawing Sheets

SHIFT REGISTER CIRCUIT

TECHNICAL FIELD

The present disclosure relates to a shift register circuit, and more particularly to a shift register circuit capable of pre-enabling a pull-down circuit thereof.

BACKGROUND

Conventionally, shift register is configured to determine whether to output a gate driving signal or not according to a control signal therein. Specifically, when there is no need to output the gate driving signal from the shift register, the control signal is stabilized in a low-voltage state so the shift register can be prevented from mistakenly outputting the gate driving signal. However, the control signal, configured for not outputting the gate driving signal, may have a surge resulted by an effect of high frequency clock signals; and the shift register may mistakenly output a gate driving signal in response to the generated surge. Thus, this is an important object to develop a shift register capable of stabilizing the control signal in a low-voltage state when there is no need to output the gate driving signal.

SUMMARY

The present disclosure discloses a shift register circuit, which includes a pull-down circuit, pull-down control circuit, a driving unit, a primary pull-down circuit and a gate driver circuit. The pull-down control circuit is electrically connected to the pull-down circuit and configured to provide an nth-stage pull-down control signal to the pull-down circuit. The driving unit is electrically connected to the pull-down control circuit and configured to drive the pull-down control circuit. The primary pull-down circuit is electrically connected to the pull-down circuit. The gate driver circuit is electrically connected to the pull-down circuit and configured to output an nth-stage gate driving signal according to an nth-stage control signal. The driving unit is configured to receive a plurality of high-frequency clock signals and accordingly to pre-enable the pull-down control circuit, and n is a positive integer.

In summary, through operating the shift register of the present disclosure under a high-voltage state only within a specific period, the stress effect generated in the shift register component is reduced and consequentially the shift register of the present disclosure has improved performance and component life. In addition, through pre-enabling the pull-down circuit, the shift register of the present disclosure can pull down the surge more quickly and efficiently. Thus, the shift register of the present disclosure has smaller stress effect, improved pull-down ability and longer component life.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
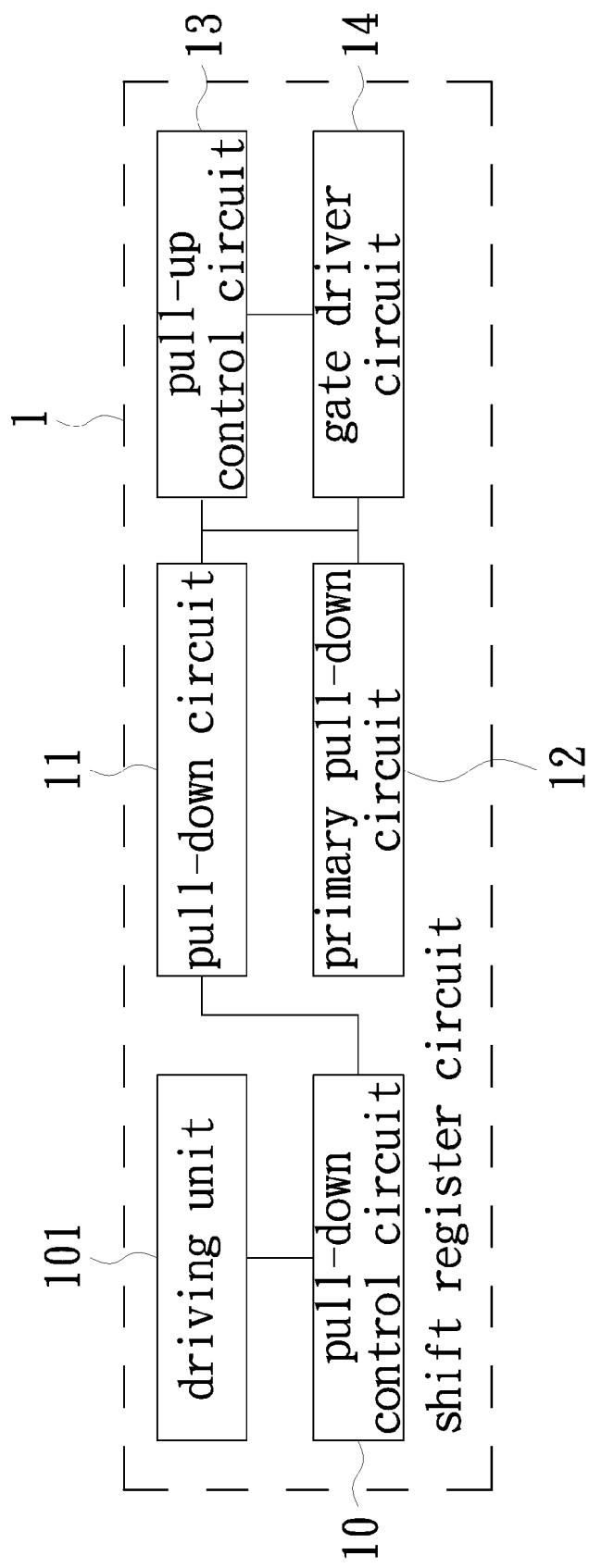
FIG. 1 is a schematic block view of a shift register circuit in accordance with an embodiment of the present disclosure.

FIG. 1 is a schematic block view of a shift register circuit in accordance with an embodiment of the present disclosure. As shown, the shift register circuit 1 in the present embodiment includes a pull-down control circuit 10, a pull-down circuit 11, a primary pull-down circuit 12, a pull-up control circuit 13 and a gate driver circuit 14.

The pull-down control circuit 10 is electrically connected to the pull-down circuit 11. Specifically, the pull-down control circuit 10 is configured to, while the present-stage control signal of the shift register 1 is affected by a system clock signal (for example, a present-stage high-frequency clock signal) and thereby resulting a surge within a specific period configured for not outputting a gate driving signal, enable the pull-down circuit 11 to pull down the surge of the present-stage control signal to have a low-voltage stage configured for not outputting the gate driving signal and thereby preventing the respective gate line from being mistakenly driven by the surge of the present-stage control signal. The pull-down control circuit 10 is further electrically connected to a driving unit 101, which is configured to receive a plurality of high-frequency clock signals and accordingly control the pull-down control circuit 10 to pre-enable the pull-down circuit 11. Thus, when surges occur, the pre-enabled pull-down circuit 11 can pull down the surges to have low-voltage states more quickly and efficiently and thereby preventing the respective gate line from being mistakenly driven. The pull-down circuit 11 is electrically connected to the primary pull-down circuit 12, the pull-up control circuit 13 and the gate driver circuit 14. The primary pull-down circuit 12 is configured to pull down the present-stage control signal to have a low-voltage state when a work cycle of the present-stage control signal is ended (that is, when there is no need to output the gate driving signal). The pull-up control circuit 13 is configured to generate the control signal two stages after the present-stage control signal according to the received present-stage control signal. The gate driver circuit 14 is configured to receive the present-stage control signal and accordingly output the present-stage gate driving signal.

Figure 2:
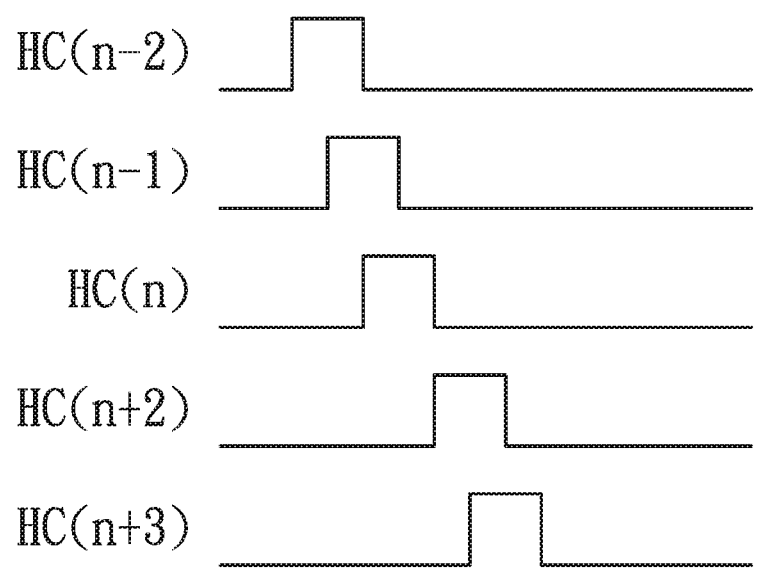
FIG. 2 is a timing diagram of a plurality of high-frequency clock signals used in the shift register in accordance with one embodiment of the present disclosure.

FIG. 2 is a timing diagram of a plurality of high-frequency clock signals used in the shift register in accordance with one embodiment of the present disclosure; wherein HC(n−2), HC(n−1), HC(n), HC(n+1), HC(n+2) and HC(n+3) are referred to the (n−2)th-stage high-frequency clock signal, the (n−1)th-stage high-frequency clock signal, the nth-stage high-frequency clock signal, the (n+1)th-stage high-frequency clock signal, the (n+2)th-stage high-frequency clock signal and the (n+3)th-stage high-frequency clock signal, respectively, and n is a positive integer. Specifically, the enabled periods of all the high-frequency clock signals HC(n−2), HC(n−1), HC(n), HC(n+1), HC(n+2) and HC(n+3) are configured to have the same time length and the same voltage level. In addition, the high-frequency clock signal HC(n+3) has a preset time lag relative to the high-frequency clock signal HC(n+2); the high-frequency clock signal HC(n+2) has the preset time lag relative to the high-frequency clock signal HC(n+1); the high-frequency clock signal HC(n+1) has the preset time lag relative to the high-frequency clock signal HC(n); the high-frequency clock signal HC(n) has the preset time lag relative to the high-frequency clock signal HC(n−1); and the high-frequency clock signal HC(n−1) has the preset time lag relative to the high-frequency clock signal HC(n−2).

Figure 3:
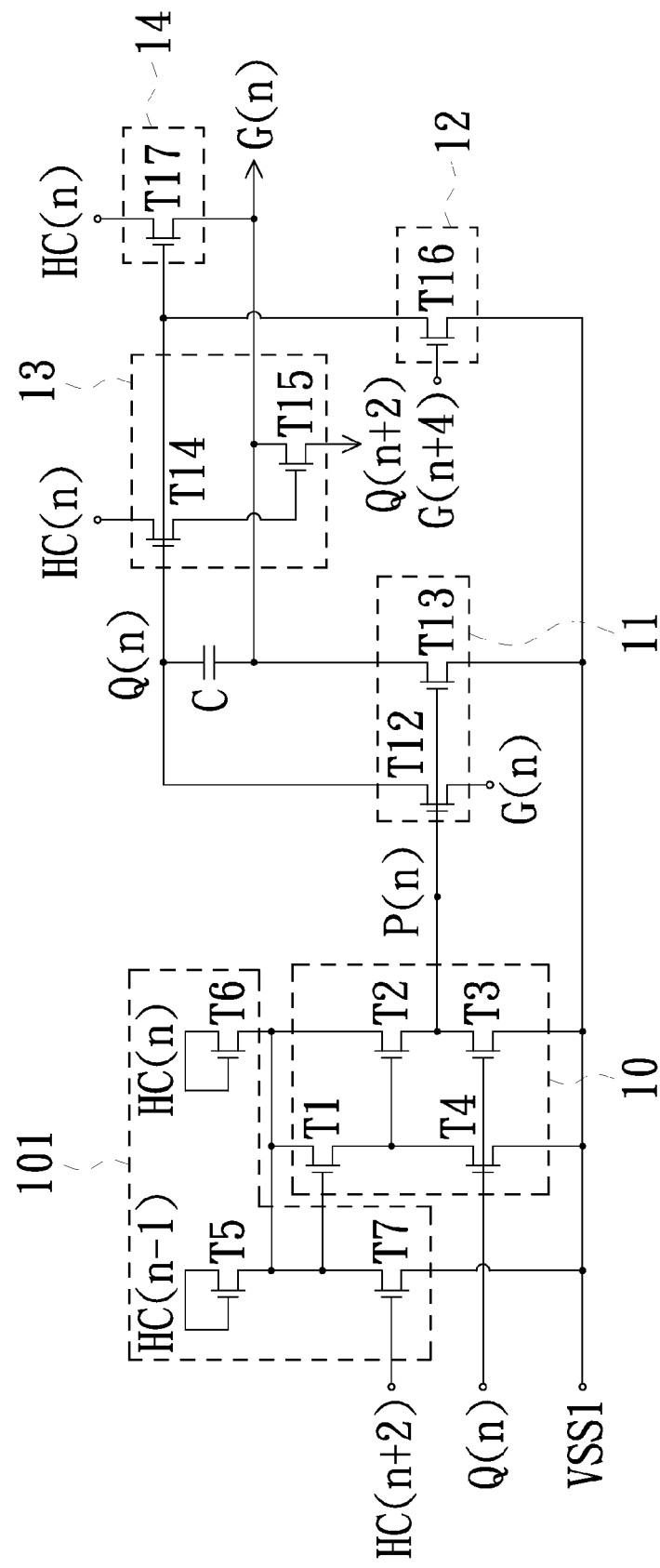
FIG. 3 is a schematic circuit view of a shift register circuit in accordance with an embodiment of the present disclosure.

FIG. 3 is a schematic circuit view of a shift register circuit consisting of the aforementioned pull-down control circuit 10, the pull-down circuit 11, the primary pull-down circuit 12, the pull-up control circuit 13 and the gate driver circuit 14 shown in FIG. 1 in accordance with an embodiment of the present disclosure. As shown, the pull-down control circuit 10 includes a first transistor T1, a second transistor T2, a third transistor T3 and a fourth transistor T4. The second transistor T2 is configured to have its gate terminal electrically connected to the second terminal of the first transistor T1; its first terminal electrically connected to the first terminal of the first transistor T1; and its second terminal electrically connected to the pull-down circuit 11 and for outputting the nth-stage pull-down control signal P(n) to the pull-down circuit 11. The third transistor T3 is configured to have its gate terminal for receiving the nth-stage control signal Q(n); its first terminal electrically connected to the second terminal of the second transistor T2 and the pull-down circuit 11; and its second terminal for receiving a low supply voltage VSS1. The fourth transistor T4 is configured to have its gate terminal for receiving the nth-stage control signal Q(n); its first terminal electrically connected to the second terminal of the first transistor T1 and the gate terminal of the second transistor T2; and its second terminal for receiving the low supply voltage VSS1. Specifically, the third transistor T3 and the fourth transistor T4 are corporately configured to, while the nth-stage control signal Q(n) is in a work cycle configured for outputting the nth-stage gate driving signal G(n), stabilize the pull-down circuit 11 in a low-voltage state and thereby preventing the pull-down circuit 11 from being enabled to mistakenly pull down the nth-stage control signal Q(n) when there is a need to output the nth-stage gate driving signal G(n).

The pull-down control circuit 10, electrically connected to the pull-down circuit 11, is configured to enable the pull-down circuit 11 to perform a pull-down operation. The pull-down circuit 11 includes a twelfth transistor T12 and a thirteenth transistor T13. The twelfth transistor T12 is configured to have its gate terminal electrically connected to the second terminal of the second transistor T2 and the first terminal of the third transistor T3 and for receiving the nth-stage pull-down control signal P(n) which is transmitted from the pull-down control circuit 10; its first terminal for receiving the nth-stage control signal Q(n); and its second terminal for receiving the nth-stage gate driving signal G(n). The thirteenth transistor T13 is configured to have its gate terminal electrically connected to the second terminal of the second transistor T2 and the first terminal of the third transistor T3 and for receiving the nth-stage pull-down control signal P(n); its first terminal for receiving the nth-stage gate driving signal G(n); and its second terminal for receiving the low supply voltage VSS1.

The primary pull-down circuit 12 is configured to, when the (n+4)th-stage gate driving signal G(n+4) is received, pull down the nth-stage control signal Q(n) to have a low-voltage state configured for not outputting the gate driving signal. The primary pull-down circuit 12 includes a sixteenth transistor T16. The sixteenth transistor T16 is configured to have its gate terminal for receiving the (n+4)th-stage gate driving signal G(n+4); its first terminal for receiving the nth-stage control signal Q(n); and its second terminal for receiving the low supply voltage VSS1.

The pull-up control circuit 13 is configured to output the (n+2)th-stage control signal Q(n+2). The pull-up control circuit 13 includes a fourteenth transistor T14 and a fifteenth transistor T15. The fourteenth transistor T14 is configured to have its gate terminal for receiving the nth-stage control signal Q(n); its first terminal for receiving the nth-stage high-frequency clock signal HC(n); and its second terminal electrically connected to the gate terminal of the fifteenth transistor T15. The fifteenth transistor T15 is configured to have its first terminal electrically connected to the first terminal of the f thirteenth transistor T13 and for receiving the nth-stage gate driving signal G(n); and its second terminal for outputting the (n+2)th-stage control signal Q(n+2).

The gate driver circuit 14 is configured to output the nth-stage gate driving signal G(n) to drive the respective gate line. The gate driver circuit 14 includes a seventeenth transistor T17. The seventeenth transistor T17 is configured to have its gate terminal for receiving the nth-stage control signal Q(n); its first terminal for receiving the nth-stage high-frequency clock signal HC(n); and its second terminal electrically connected to the first terminal of the thirteenth transistor T13 and the first terminal of the fifteenth transistor T15 and for outputting the nth-stage gate driving signal G(n). According to the aforementioned circuit structure, it is understood that the seventeenth transistor T17 is configured to output the nth-stage gate driving signal G(n), which is derived from the nth-stage high-frequency clock signal HC(n) supplied into the first terminal, through the second output terminal when the seventeenth transistor T17 receives the nth-stage control signal Q(n).

The pull-down control circuit 10 is further electrically connected to the driving unit 101. The driving unit 101 includes a fifth transistor T5, a sixth transistor T6 and a seventh transistor T7. The fifth transistor T5 is configured to have its gate terminal and its first terminal electrically connected to each other and for receiving the (n−1)th-stage high-frequency clock signal HC(n−1); and its second terminal electrically connected to the gate terminal of the first transistor T1, the first terminal of the first transistor T1 and the first terminal of the second transistor T2. The sixth transistor T6 is configured to have its gate terminal and its first terminal electrically connected to each other and for receiving the nth-stage high-frequency clock signal HC(n); and its second terminal electrically connected to the gate terminal of the first transistor T1, the first terminal of the first transistor T1, the first terminal of the second transistor T2 and the second terminal of the fifth transistor T5. The seventh transistor T7 is configured to have its gate terminal for receiving the (n+2)th-stage high-frequency clock signal HC(n+2); its first terminal electrically connected to the gate terminal of the first transistor T1, the first terminal of the first transistor T1, the first terminal of the second transistor T2, the second terminal of the fifth transistor T5 and the second terminal of the sixth transistor T6; and its second terminal for receiving the low supply voltage VSS1. Specifically, the seventh transistor T7 is configured to stabilize the pull-down control circuit 10 in a low-voltage state within the enabled period of the (n+2)th-stage high-frequency clock signal HC(n+2) and thereby preventing the pull-down control circuit 10 from being enabled in the non-work cycle (that is, the period no need to pull down the surges).

According to the aforementioned circuit configuration, it is noted that the fifth transistor T5 is turned on by the (n−1)th-stage high-frequency clock signal HC(n−1) when the nth-stage control signal Q(n) has a non-work cycle configured for not outputting the gate driving signal; and accordingly the pull-down control circuit 10 (specifically, the first transistor T1 and the second transistor T2 therein) is enabled by a voltage outputted from the turned-on fifth transistor T5 and thereby making the pull-down control circuit 10 output the nth-stage pull-down control signal P(n) to enable the pull-down circuit 11 before nth-stage high-frequency clock signal HC(n). Then, the sixth transistor T6 is enabled by the nth-stage high-frequency clock signal HC(n) when the nth-stage control signal Q(n) has a non-work cycle configured for not outputting the gate driving signal; and accordingly the pull-down control circuit 10 (specifically, the first transistor T1 and the second transistor T2 therein) is enabled by a voltage outputted from the turned-on sixth transistor T6. Because the pull-down circuit 11 has been pre-enabled in the period of the (n−1)th-stage high-frequency clock signal HC(n−1), the surge occurring in the non-work cycle of the nth-stage control signal Q(n) configured for not outputting the gate driving signal can be pulled down more quickly and effectively. As a result, the respective gate line can be prevented from being mistakenly driven by the surge. In addition, because the pull-down control circuit 10 is enabled only within the periods of the (n−1)th-stage high-frequency clock signal HC(n−1) and the nth-stage high-frequency clock signal HC(n), the duration of the pull-down control circuit 10 operated in a high-voltage state is significantly reduced and consequentially the stress effect of the shift register disclosed in the present embodiment is reduced.

Figure 4:
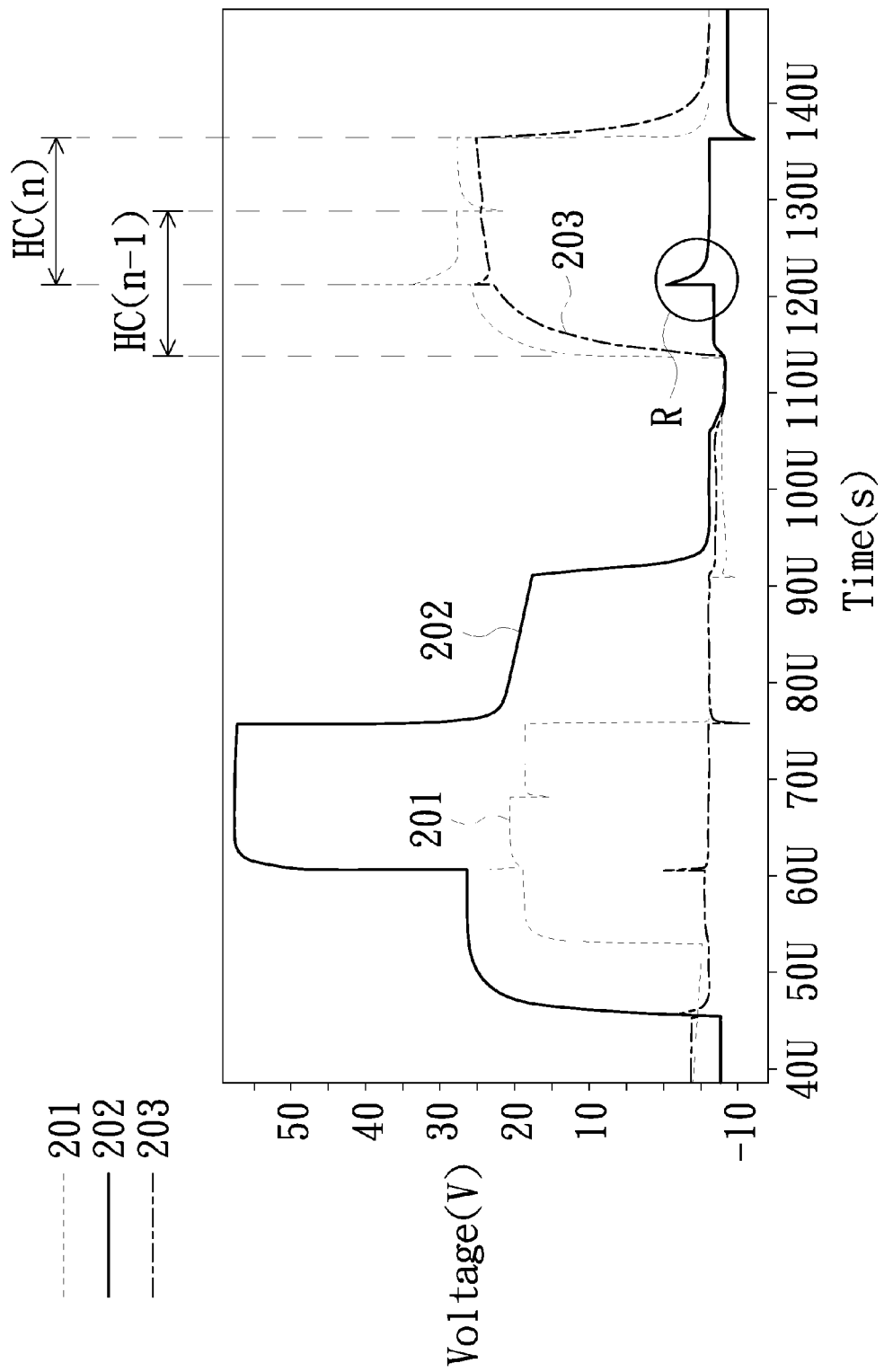
FIG. 4 is a simulation chart of some specific signals used in the shift register in accordance with one embodiment of the present disclosure.

Please refer to FIGS. 3 and 4. FIG. 4 is a simulation chart of some specific signals used in the shift register in accordance with one embodiment of the present disclosure. Specifically, the X-axis is time degree; the Y-axis is voltage degree; 201 is the waveform of the voltage outputted from the second terminals of the fifth transistor T5 and the sixth transistor T6 (FIG. 3); 202 is the waveform of the nth-stage control signal Q(n); and 203 is the waveform of the nth-stage pull-down control signal P(n). As shown in FIG. 4, before the nth-stage control signal Q(n) (202) is converted into a low-voltage state configured for not outputting the gate driving signal, the voltage outputted from the second terminals of the fifth transistor T5 and the sixth transistor T6 (201) is converted to have a high-voltage state configured for controlling the pull-down control circuit 10 to pre-enable the pull-down circuit 11. In other words, the nth-stage pull-down control signal P(n) (203), for enabling the pull-down circuit 11, is converted into the high-voltage state within the period of the (n−1)th-stage high-frequency clock signal HC(n−1). As a result, the surge R occurring within the period of the nth-stage high-frequency clock signal HC(n) can be pulled down more quickly and efficiently by the pull-down circuit 11, which has been pre-enabled within the period of the (n−1)th-stage high-frequency clock signal HC(n−1); and consequentially the respective gate line is prevented from being mistakenly driven by the surge R of the nth-stage control signal Q(n) (202).

In summary, by pre-enabling the pull-down circuit 11 within the period of the (n−1)th-stage high-frequency clock signal HC(n−1), the shift register of the present disclosure can pull down the surge R of the nth-stage control signal Q(n) (202) occurring within the period of the nth-stage high-frequency clock signal HC(n) more quickly and efficiently. It is noted that a well pull-down performance is still can be obtained by directly supplying a high-voltage level to the pull-down control circuit 10; operating a component in a long-term high-voltage state may result a serious stress effect so the shift register may not meet the market requirement. In addition, although the stress effect may be effectively reduced by interestingly driving the plurality of pull-down control circuits and the respective pull-down circuits, the component size of the shift register as well as the circuit design difficulty are significantly increased. According to the aforementioned description, it is understood that the shift register of the present disclosure can have qualified pull-down ability without being implemented with a large number of components and a larger component size. In addition, because the pull-down control circuit 10 of the present disclosure is enabled only within the periods the (n−1)th-stage high-frequency clock signal HC(n−1) and the nth-stage high-frequency clock signal HC(n), the duration of the pull-down control circuit 10 operated in a high-voltage state is significantly reduced and consequentially the stress effect of the shift register disclosed in the present embodiment is reduced.

Figure 5:
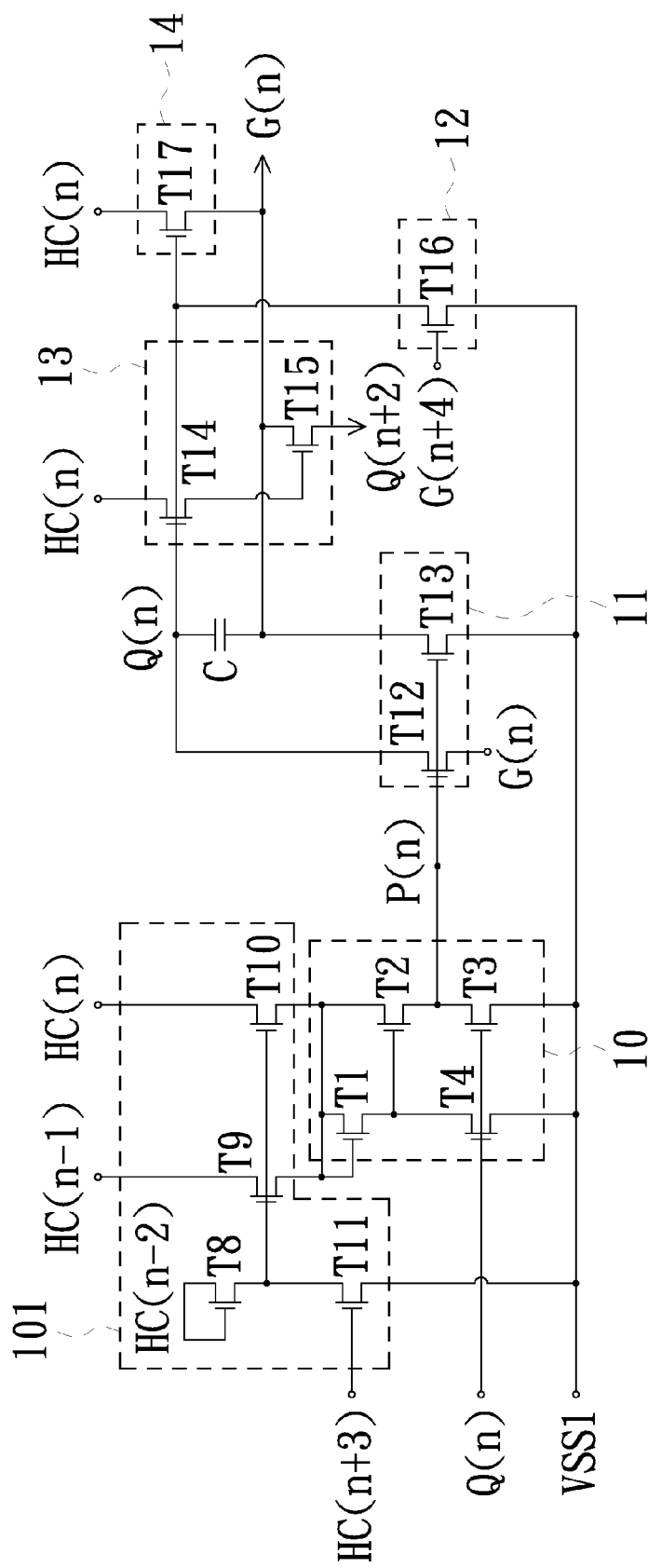
FIG. 5 is a schematic circuit view of a shift register circuit in accordance with another embodiment of the present disclosure.

FIG. 5 is a schematic circuit view of a shift register circuit consisting of the aforementioned pull-down control circuit 10, the pull-down circuit 11, the primary pull-down circuit 12, the pull-up control circuit 13 and the gate driver circuit 14 shown in FIG. 1 in accordance with another embodiment of the present disclosure.

The pull-down control circuit 10 includes a first transistor T1, a second transistor T2, a third transistor T3 and a fourth transistor T4. The second transistor T2 is configured to have its gate terminal electrically connected to the second terminal of the first transistor T1; its first terminal electrically connected to the first terminal of the first transistor T1; and its second terminal electrically connected to the pull-down circuit 11 and for outputting the nth-stage pull-down control signal P(n) to the pull-down circuit 11. The third transistor T3 is configured to have its gate terminal for receiving the nth-stage control signal Q(n); its first terminal electrically connected to the second terminal of the second transistor T2 and the pull-down circuit 11; and its second terminal for receiving the low supply voltage VSS1. The fourth transistor T4 is configured to have its gate terminal for receiving the nth-stage control signal Q(n); its first terminal electrically connected to the second terminal of the first transistor T1 and the gate terminal of the second transistor T2; and its second terminal for receiving the low supply voltage VSS1. Specifically, the third transistor T3 and the fourth transistor T4 are corporately configured to, while the nth-stage control signal Q(n) is in a work cycle configured for outputting the nth-stage gate driving signal G(n), stabilize the pull-down circuit 11 in a low-voltage state and thereby preventing the pull-down circuit 11 from being enabled to mistakenly pull down the nth-stage control signal Q(n) when there is a need to output the nth-stage gate driving signal G(n).

The pull-down control circuit 10, electrically connected to the pull-down circuit 11, is configured to enable the pull-down circuit 11 to perform a pull-down operation. The pull-down circuit 11 includes a twelfth transistor T12 and a thirteenth transistor T13. The twelfth transistor T12 is configured to have its gate terminal electrically connected to the second terminal of the second transistor T2 and the first terminal of the third transistor T3 and for receiving the nth-stage pull-down control signal P(n) which is transmitted from the pull-down control circuit 10; its first terminal for receiving the nth-stage control signal Q(n); and its second terminal for receiving the nth-stage gate driving signal G(n). The thirteenth transistor T13 is configured to have its gate terminal electrically connected to the second terminal of the second transistor T2 and the first terminal of the third transistor T3 and for receiving the nth-stage pull-down control signal P(n); its first terminal for receiving the nth-stage gate driving signal G(n); and its second terminal for receiving the low supply voltage VSS1.

The primary pull-down circuit 12 is configured to, when the (n+4)th-stage gate driving signal G(n+4) is received, pull down the nth-stage control signal Q(n) to have a low-voltage state configured for not outputting the gate driving signal. The primary pull-down circuit 12 includes a sixteenth transistor T16. The sixteenth transistor T16 is configured to have its gate terminal for receiving the (n+4)th-stage gate driving signal G(n+4); its first terminal for receiving the nth-stage control signal Q(n); and its second terminal for receiving the low supply voltage VSS1.

The pull-up control circuit 13 is configured to output the (n+2)th-stage control signal Q(n+2). The pull-up control circuit 13 includes a fourteenth transistor T14 and a fifteenth transistor T15. The fourteenth transistor T14 is configured to have its gate terminal for receiving the nth-stage control signal Q(n); its first terminal for receiving the nth-stage high-frequency clock signal HC(n); and its second terminal electrically connected to the gate terminal of the fifteenth transistor T15. The fifteenth transistor T15 is configured to have its first terminal electrically connected to the first terminal of the thirteenth transistor T13; and its second terminal for outputting the (n+2)th-stage control signal Q(n+2).

The gate driver circuit 14 is configured to output the nth-stage gate driving signal G(n) to drive the respective gate line. The gate driver circuit 14 includes a seventeenth transistor T17. The seventeenth transistor T17 is configured to have its gate terminal for receiving the nth-stage control signal Q(n); its first terminal for receiving the nth-stage high-frequency clock signal HC(n); and its second terminal electrically connected to the first terminal of the thirteenth transistor T13 and the first terminal of the fifteenth transistor T15 and for outputting the nth-stage gate driving signal G(n). According to the aforementioned circuit structure, it is understood that the seventeenth transistor T17 is configured to output the nth-stage gate driving signal G(n), which is derived from the nth-stage high-frequency clock signal HC(n) supplied into the first terminal, through the second output terminal when the seventeenth transistor T17 receives the nth-stage control signal Q(n).

The pull-down control circuit 10 is further electrically connected to the driving unit 101, which includes an eighth transistor T8, a ninth transistor T9, a tenth transistor T10 and an eleventh transistor T11.

As shown in FIG. 5, the eighth transistor T8 is configured to have its gate terminal and its first terminal electrically connected to each other and for receiving the (n−2)th-stage high-frequency clock signal HC(n−2). Specifically, the eighth transistor T8 is for pre-enabling the ninth transistor T9 and the tenth transistor T10 in the period of the (n−2)th-stage high-frequency clock signal HC(n−2). The ninth transistor T9 is configured to have its gate terminal electrically connected to the second terminal of the eighth transistor T8; its first terminal for receiving the (n−1)th-stage high-frequency clock signal HC(n−1); and its second terminal electrically connected to the gate terminal of the first transistor T1, the first terminal of the first transistor T1 and the first terminal of the second transistor T2. Specifically, the ninth transistor T9 is for pre-enabling, through a first voltage outputted form the second terminal, the pull-down control circuit 10 within the period of the (n−1)th-stage high-frequency clock signal HC(n−1). It is noted that in the period when the ninth transistor T9 receives the (n−1)th-stage high-frequency clock signal HC(n−1) but the tenth transistor T10 does not receive the nth-stage high-frequency clock signal HC(n) yet, a portion of the current flowing through the ninth transistor T9 is outputted through the first terminal of the transistor tenth T10; wherein herein the voltage at the second terminals of the ninth transistor T9 and the tenth transistor T10 is referred to as the first voltage, and the first voltage has a voltage level lower than that of a high voltage. In addition, in the period when both of the ninth transistor T9 receives the (n−1)th-stage high-frequency clock signal HC(n−1) and the tenth transistor T10 receives the nth-stage high-frequency clock signal HC(n), no current flowing through the ninth transistor T9 is outputted through the first terminal of the tenth transistor T10; wherein herein the voltage at the second terminals of the ninth transistor T9 and the tenth transistor T10 is referred to as the second voltage, and the second voltage has a high-voltage level.

The tenth transistor T10 is configured to have its gate terminal electrically connected to the second terminal of the eighth transistor T8; its first terminal for receiving the nth-stage high-frequency clock signal HC(n); and its second terminal electrically connected to the gate terminal of the first transistor T1, the first terminal of the first transistor T1 and the first terminal of the second transistor T2. Specifically, the tenth transistor T10 is for providing a third voltage outputted though the second terminal to enable the pull-down control circuit 10 within the period of the nth-stage high-frequency clock signal HC(n). It is noted that in the period when the tenth transistor T10 receives the nth-stage high-frequency clock signal HC(n) but the ninth transistor T9 does not receive the (n−1)th-stage high-frequency clock signal HC(n−1) yet, a portion of the current flowing through the tenth transistor T10 is outputted through the first terminal of the ninth transistor T9; wherein herein the voltage at the second terminals of the ninth transistor T9 and the tenth transistor T10 is referred to as the third voltage, and the third voltage has a voltage level lower than that of a high voltage. The eleventh transistor T11 is configured to have its gate terminal for receiving the (n+3)th-stage high-frequency clock signal HC(n+3) and thereby stabilizing the pull-down control circuit 10 in a low-voltage state; its first terminal electrically connected to the second terminal of the eighth transistor T8, the gate terminal of the ninth transistor T9 and the gate terminal of the tenth transistor T10; and its second terminal for receiving the low power supply voltage VSS1 and thereby preventing the pull-down control circuit 10 from being enabled in the non-work cycle.

According to the aforementioned circuit configuration, it is noted that the eighth transistor T8 is turned on by the (n−2)th-stage high-frequency clock signal HC(n−2) when the nth-stage control signal Q(n) has a non-work cycle configured for not outputting the gate driving signal; and accordingly the ninth transistor T9 and the tenth transistor T10 are pre-enabled. Thus, when the ninth transistor T9 receives the (n−1)th-stage high-frequency clock signal HC(n−1), the aforementioned first voltage can be immediately transmitted to the pull-down control circuit 10 for pre-enabling the pull-down circuit 11; wherein it is noted that the first voltage has a voltage level lower than that of a high voltage. When the tenth transistor T10 receives the nth-stage high-frequency clock signal HC(n), the aforementioned second voltage can be transmitted to the pull-down control circuit 10 through the ninth transistor T9 and the tenth transistor T10 within the overlaying period of the (n−1)th-stage high-frequency clock signal HC(n−1) and the nth-stage high-frequency clock signal HC(n) (FIG. 2 or 6); wherein it is noted that the second voltage has a high-voltage level. Within the overlaying period of the (n−1)th-stage high-frequency clock signal HC(n−1) and the nth-stage high-frequency clock signal HC(n), the pull-down control circuit 10 recharges the nth-stage pull-down control signal P(n) to have a high-voltage state; as a result, the pull-down circuit 11 can pull down the surge R. In addition, because the n-stage pull-down control signal P(n) has a high-voltage state, the pull-down circuit 11 has a better pull-down ability so the respective gate line is effectively prevented from being mistakenly driven by the surge R.

In summary, by configuring the pull-down circuit 10 to receive a plurality of high frequency signals with different voltage levels in a gradual manner, the shift register of the present disclosure is operated in a high-voltage state only within the overlaying period of the (n−1)th-stage high-frequency clock signal HC(n−1) and the nth-stage high-frequency clock signal HC(n); consequentially, the stress effect resulted under a high voltage is reduced. In addition, because the pull-down circuit 10 is pre-charged to the voltage level of the nth-stage pull-down control signal P(n) within the period of the (n−1)th-stage high-frequency clock signal HC(n−1), the time for the nth-stage pull-down control signal P(n) to be recharged to the high-voltage level is significantly reduced; and consequentially the pull-down circuit 11 can pull down the surge R more quickly and efficiently and accordingly the shift register of the present disclosure can efficiently reduce the stress effect and has a better pull-down ability.

Figure 6:
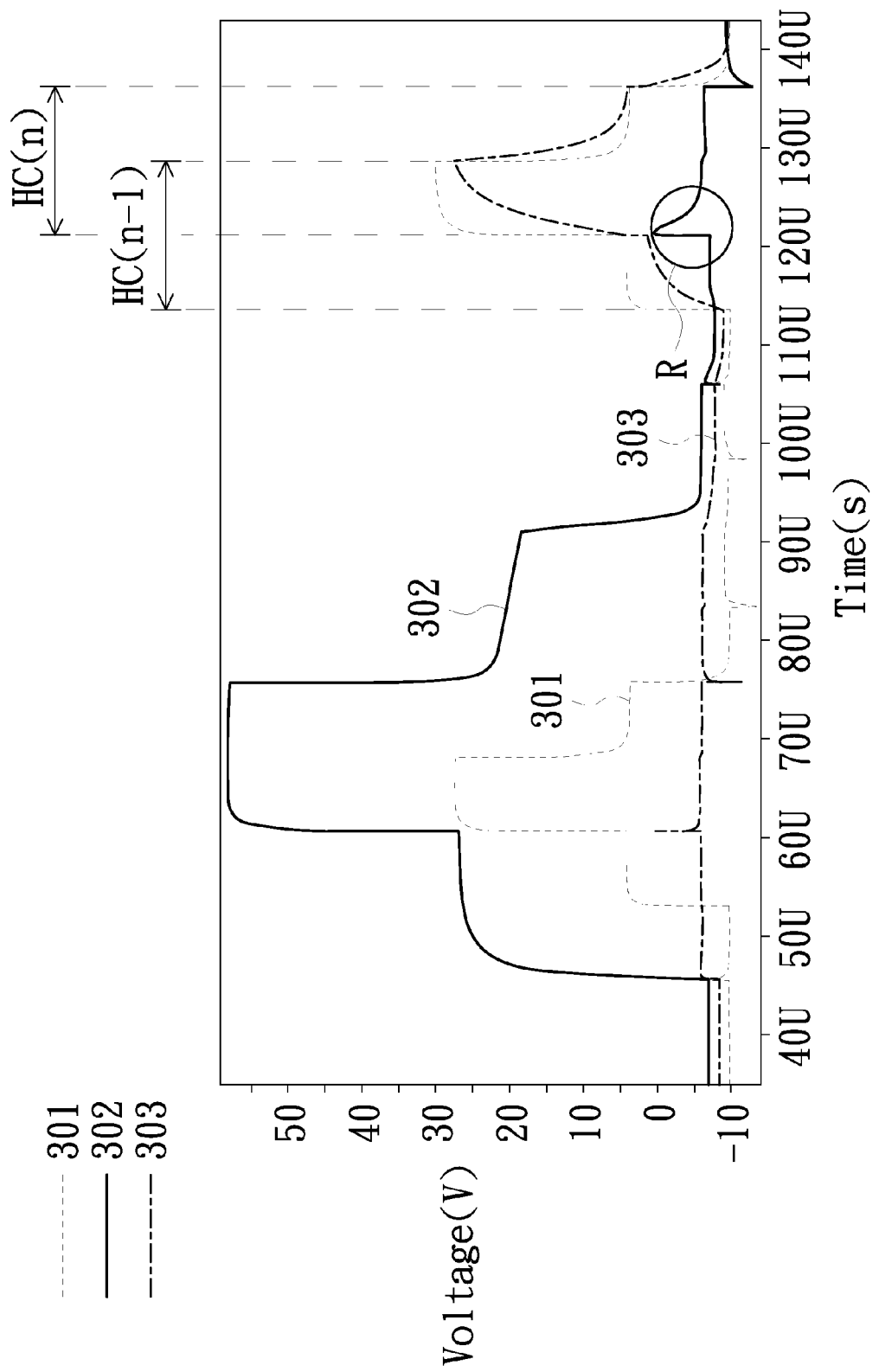
FIG. 6 is a simulation chart of some specific signals used in the shift register in accordance with another embodiment of the present disclosure.

Please refer to FIGS. 5 and 6. FIG. 6 is a simulation chart of some specific signals used in the shift register in accordance with one embodiment of the present disclosure. Specifically, the X-axis is time degree; the Y-axis is voltage degree; 301 is the waveform of the voltage outputted from the second terminals of the ninth transistor T9 and the tenth transistor T10; 302 is the waveform of the nth-stage control signal Q(n); and 203 is the waveform of the nth-stage pull-down control signal P(n). When the nth-stage control signal Q(n) (302) is in a non-work cycle configured for not outputting the gate driving signal, the eighth transistor T8 pre-enables the ninth transistor T9 and the tenth transistor T10 within the period of the (n−2)th-stage high-frequency clock signal HC(n−2). In the period when the ninth transistor T9 receives the (n−1)th-stage high-frequency clock signal HC(n−1) but the tenth transistor T10 does not receive the nth-stage high-frequency clock signal HC(n) yet, the second terminal of the ninth transistor T9 transmits the first voltage to the pull-down control circuit 10; wherein the first voltage has a voltage level lower than that of a high voltage. In addition, in the period when the tenth transistor T10 receives the nth-stage high-frequency clock signal HC(n) but the ninth transistor T9 does not receive the (n−1)th-stage high-frequency clock signal HC(n−1) yet, the second terminal of the tenth transistor T10 transmits the third voltage to the pull-down control circuit 10; wherein the third voltage has a voltage level lower than that of a high voltage. In addition, in the overlaying period of the (n−1)th-stage high-frequency clock signal HC(n−1) and the nth-stage high-frequency clock signal HC(n), the second voltage is transmitted to the pull-down control circuit 10; wherein the second voltage has a high-voltage level. In other words, the nth-stage pull-down control signal P(n) (303), for enabling the pull-down circuit 11, is converted to the high-voltage level within the overlaying period of the (n−1)th-stage high-frequency clock signal HC(n−1) and the nth-stage high-frequency clock signal HC(n). As a result, the surge R can be pulled down more quickly and efficiently by the pull-down circuit 11; and consequentially the respective gate line is prevented from being mistakenly driven by the surge R.

In summary, through operating the shift register of the present disclosure under a high-voltage state only within a specific period, the stress effect generated in the shift register component is reduced and consequentially the shift register of the present disclosure has improved performance and component life. In addition, through pre-enabling the pull-down circuit, the shift register of the present disclosure can pull down the surge more quickly and efficiently. Thus, the shift register of the present disclosure has smaller stress effect, improved pull-down ability and longer element life.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register circuit, comprising:
   a pull-down circuit;
   a pull-down control circuit, electrically connected to the pull-down circuit and configured to enabled the pull-down circuit and provide an nth-stage pull-down control signal to the pull-down circuit;
   a driving unit, electrically connected to the pull-down control circuit and configured to drive the pull-down control circuit;
   a primary pull-down circuit, electrically connected to the pull-down circuit; and
   a gate driver circuit, electrically connected to the pull-down circuit and configured to output an nth-stage gate driving signal according to an nth-stage control signal, wherein the driving unit is configured to receive a plurality of high-frequency clock signals and accordingly to pre-enable the pull-down control circuit in the overlaying period of the each two adjacent high-frequency clock signals, and n is a positive integer;
   wherein the pull-down control circuit comprises:
      a first transistor;
      a second transistor, configured to have its gate terminal electrically connected to a second terminal of the first transistor, its first terminal electrically connected to a first terminal of the first transistor, and its second terminal electrically connected to the pull-down circuit and for providing the nth-stage pull-down control signal;
      a third transistor, configured to have its gate terminal for receiving the nth-stage control signal, its first terminal electrically connected to the second terminal of the second transistor and the pull-down circuit, and its second terminal for receiving a low power supply voltage; and
      a fourth transistor, configured to have its gate terminal for receiving the nth-stage control signal, its first terminal electrically connected to the second terminal of the first transistor and the gate terminal of the second transistor, and its second terminal for receiving the low power supply voltage.

2. The shift register circuit according to claim 1, wherein the plurality of high-frequency clock signals comprise a (n−1)th-stage high-frequency clock signal, a nth-stage high-frequency clock signal and a (n+2)th-stage high-frequency clock signal, wherein the (n−1)th-stage high-frequency clock signal has a preset time lead relative to the nth-stage high-frequency clock signal, wherein enabled periods of the (n−1)th-stage high-frequency clock signal, the nth-stage high-frequency clock signal and the (n+2)th-stage high-frequency clock signal have a same time length.

3. The shift register circuit according to claim 2, wherein the driving unit comprises:
a fifth transistor, configured to have its gate terminal and its first terminal electrically connected to each other, and its second terminal electrically connected to the gate terminal of the first transistor, the first terminal of the first transistor and the first terminal of the second transistor, wherein the fifth transistor is for receiving the (n−1)th-stage high-frequency clock signal to enable the pull-down control circuit;
a sixth transistor, configured to have its gate terminal and its first terminal electrically connected to each other, and its second terminal electrically connected to the gate terminal of the first transistor, the first terminal of the first transistor, the first terminal of the second transistor and the second terminal of the fifth transistor, wherein the sixth transistor is for receiving the nth-stage high-frequency clock signal to enable the pull-down control circuit; and
a seventh transistor, configured to have its gate terminal for receiving the (n+2)th-stage high-frequency clock signal, its first terminal electrically connected to the gate terminal of the first transistor, the first terminal of the first transistor, the second terminal of the fifth transistor and the second terminal of the sixth transistor, and its second terminal for receiving the low power supply voltage, wherein the seventh transistor is for stabilizing the pull-down control circuit in a low-voltage state.

4. The shift register circuit according to claim 3, wherein the pull-down circuit comprises:
a twelfth transistor, configured to have its gate terminal electrically connected to the second terminal of the second transistor and the first terminal of the third transistor and for receiving the nth-stage pull-down control signal, its first terminal for receiving the nth-stage control signal, and its second terminal for receiving the nth-stage gate driving signal; and
a thirteenth transistor, configured to have its gate terminal electrically connected to the second terminal of the second transistor and the first terminal of the third transistor and for receiving the nth-stage pull-down control signal, its first terminal for receiving the nth-stage gate driving signal, and its second terminal for receiving the low supply voltage.

5. The shift register circuit according to claim 4, further comprising a pull-up control circuit, the pull-up control circuit comprising:
a fourteenth transistor, configured to have its gate terminal for receiving the nth-stage control signal, and its first terminal for receiving the nth-stage high-frequency clock signal; and
a fifteenth transistor, configured to have its gate terminal electrically connected to a second terminal of the fourteen transistor, its first terminal electrically connected to the first terminal of the thirteenth transistor, and its second terminal for outputting a (n+2)th-stage control signal.

6. The shift register circuit according to claim 5, wherein the primary pull-down circuit comprises:
a sixteenth transistor, configured to have its gate terminal for receiving a (n+4)th-stage gate driving signal, its first terminal for receiving a nth-stage control signal, and its second terminal for receiving the low supply voltage.

7. The shift register circuit according to claim 6, wherein the gate driver circuit comprises:
a seventeenth transistor, configured to have its gate terminal for receiving the nth-stage control signal, its first terminal for receiving the nth-stage high-frequency clock signal, and its second terminal electrically connected to the first terminal of the thirteenth transistor and the first terminal of the fifteenth transistor and for outputting the nth-stage gate driving signal.

8. The shift register circuit according to claim 1, wherein the plurality of high-frequency clock signals comprise a (n−2)th-stage high-frequency clock signal, a (n−1)th-stage high-frequency clock signal, a nth-stage high-frequency clock signal and a (n+3)th-stage high-frequency clock signal, wherein the (n−2)th-stage high-frequency clock signal has a preset time lead relative to the (n−1)th-stage high-frequency clock signal, the (n−1)th-stage high-frequency clock signal has the preset time lead relative to the nth-stage high-frequency clock signal, wherein enabled periods of the (n−2)th-stage high-frequency clock signal, the (n−1)th-stage high-frequency clock signal, the nth-stage high-frequency clock signal and the (n+3)th-stage high-frequency clock signal have a same time length.

9. The shift register circuit according to claim 8, wherein the driving unit comprises:
an eighth transistor, configured to have its gate terminal and its first terminal electrically connected to each other and for receiving the (n−2)th-stage high-frequency clock signal;
a ninth transistor, configured to have its gate terminal electrically connected to the second terminal of the eighth transistor, its first terminal for receiving the (n−1)th-stage high-frequency clock signal, and its second terminal electrically connected to the gate terminal of the first transistor, the first terminal of the first transistor and the first terminal of the second transistor;
a tenth transistor, configured to have its gate terminal electrically connected to the second terminal of the eighth transistor, its first terminal for receiving the nth-stage high-frequency clock signal, and its second terminal electrically connected to the gate terminal of the first transistor, the first terminal of the first transistor and the first terminal of the second transistor; and
an eleventh transistor, configured to have its gate terminal for receiving the (n+3)th-stage high-frequency clock signal and thereby stabilizing the pull-down control circuit in a low-voltage state, its first terminal electrically connected to the second terminal of the eighth transistor, the gate terminal of the ninth transistor and the gate terminal of the tenth transistor, and its second terminal for receiving the low power supply voltage.

10. The shift register circuit according to claim 9, wherein the pull-down circuit comprises:
a twelfth transistor, configured to have its gate terminal electrically connected to the second terminal of the second transistor and the first terminal of the third transistor and for receiving the nth-stage pull-down control signal, its first terminal for receiving the nth-stage control signal, and its second terminal for receiving the nth-stage gate driving signal; and a thirteenth transistor, configured to have its gate terminal electrically connected to the second terminal of the second transistor and the first terminal of the third transistor and for receiving the nth-stage pull-down control signal, its first terminal for receiving the nth-stage gate driving signal, and its second terminal for receiving the low supply voltage.

11. The shift register circuit according to claim 10, further comprising a pull-up control circuit, the pull-up control circuit comprising:

a fourteenth transistor, configured to have its gate terminal for receiving the nth-stage control signal, and its first terminal for receiving the nth-stage high-frequency clock signal; and a fifteenth transistor, configured to have its gate terminal electrically connected to a second terminal of the fourteen transistor, its first terminal electrically connected to the first terminal of the thirteenth transistor, and its second terminal for outputting a (n+2)th-stage control signal.

12. The shift register circuit according to claim 11, wherein the primary pull-down circuit comprises:

a sixteenth transistor, configured to have its gate terminal for receiving a (n+4)th-stage gate driving signal, its first terminal for receiving a nth-stage control signal, and its second terminal for receiving the low supply voltage.

13. The shift register circuit according to claim 12, wherein the gate driver circuit comprises:

a seventeenth transistor, configured to have its gate terminal for receiving the nth-stage control signal, its first terminal for receiving the nth-stage high-frequency clock signal, and its second terminal electrically connected to the first terminal of the thirteenth transistor and the first terminal of the fifteenth transistor and for outputting the nth-stage gate driving signal.

* * * * *